United States Patent
Leisen et al.

(10) Patent No.: US 11,038,090 B2
(45) Date of Patent: Jun. 15, 2021

(54) METHOD OF PRODUCING AN OPTOELECTRONIC COMPONENT

(71) Applicant: OSRAM OLED GmbH, Regensburg (DE)

(72) Inventors: Daniel Leisen, Regensburg (DE); Herbert Brunner, Sinzing (DE); Emilia Dinu, Regensburg (DE); Jens Eberhard, Lemgo (DE); Christina Keith, Neutraubling (DE); Markus Pindl, Tegernheim (DE); Thomas Reeswinkel, Regensburg (DE); Daniel Richter, Bad Abbach (DE); Christopher Wiesmann, Barbing (DE); Ludwig Peyker, Regensburg (DE); Alexander Linkov, Herzogenrath (DE)

(73) Assignee: OSRAM OLED GmbH, Regensburg (DE)

( * ) Notice: Subject to any disclaimer, the term of this patent is extended or adjusted under 35 U.S.C. 154(b) by 25 days.

(21) Appl. No.: 16/632,613

(22) PCT Filed: Jul. 31, 2018

(86) PCT No.: PCT/EP2018/070761
§ 371 (c)(1),
(2) Date: Jan. 21, 2020

(87) PCT Pub. No.: WO2019/025453
PCT Pub. Date: Feb. 7, 2019

(65) Prior Publication Data
US 2021/0135068 A1     May 6, 2021

(30) Foreign Application Priority Data
Aug. 1, 2017 (DE) .................... 10 2017 117 438.9

(51) Int. Cl.
H01L 33/54 (2010.01)
H01L 33/50 (2010.01)
(Continued)

(52) U.S. Cl.
CPC .......... H01L 33/54 (2013.01); H01L 31/0203 (2013.01); H01L 31/02322 (2013.01);
(Continued)

(58) Field of Classification Search
CPC .......... H01L 31/0203; H01L 31/02322; H01L 31/18; H01L 33/54; H01L 33/502;
(Continued)

(56) References Cited

U.S. PATENT DOCUMENTS 9,231,175 B2   1/2016  Sato
9,461,217 B2   10/2016 Chan et al.
(Continued)

FOREIGN PATENT DOCUMENTS

DE    101 35 190 A1    2/2003
EP    2 846 367 A1     3/2015
(Continued)

*Primary Examiner* — Igwe U Anya
(74) *Attorney, Agent, or Firm* — DLA Piper LLP (US)

(57) ABSTRACT

A method of manufacturing an optoelectronic component includes providing a carrier with an upper side; arranging an optoelectronic semiconductor chip above the upper side of the carrier; arranging a casting material over the upper side of the carrier, wherein the optoelectronic semiconductor chip is embedded in the casting material, and the casting material forms a cast surface; and removing a portion of the casting material at the cast surface, wherein a topography is generated at the cast surface, and the removal of a portion of the casting material at the cast surface takes place through laser interference structuring.

6 Claims, 3 Drawing Sheets

(51) Int. Cl.
*H01L 33/56* (2010.01)
*H01L 31/0203* (2014.01)
*H01L 31/18* (2006.01)
*H01L 31/0232* (2014.01)

(52) U.S. Cl.
CPC ............ *H01L 31/18* (2013.01); *H01L 33/502* (2013.01); *H01L 33/56* (2013.01); *H01L 2933/005* (2013.01); *H01L 2933/0041* (2013.01); *H01L 2933/0091* (2013.01)

(58) Field of Classification Search
CPC ............. H01L 33/56; H01L 2933/0041; H01L 2933/005; H01L 2933/0091
USPC .......................................................... 438/27
See application file for complete search history.

(56) References Cited

U.S. PATENT DOCUMENTS

| 10,886,426 | B2* | 1/2021 | Dirscherl | H01L 24/96 |
| 2003/0151361 | A1 | 8/2003 | Ishizaka | |
| 2003/0189217 | A1* | 10/2003 | Imai | H01L 33/44 |
| | | | | 257/99 |
| 2004/0241894 | A1* | 12/2004 | Nagai | H01L 25/0753 |
| | | | | 438/22 |
| 2007/0212802 | A1 | 9/2007 | Lee et al. | |
| 2012/0058580 | A1 | 3/2012 | Xu | |
| 2013/0207141 | A1 | 8/2013 | Reiherzer | |
| 2014/0284652 | A1 | 9/2014 | Shimada et al. | |
| 2016/0013376 | A1* | 1/2016 | Maki | H01L 33/54 |
| | | | | 257/88 |
| 2016/0268487 | A1 | 9/2016 | Camras et al. | |

FOREIGN PATENT DOCUMENTS

| JP | 2010-157637 A | 7/2010 |
| JP | 2014-120550 A | 6/2014 |
| WO | 2016/134250 A1 | 8/2016 |

* cited by examiner

METHOD OF PRODUCING AN OPTOELECTRONIC COMPONENT

TECHNICAL FIELD

This disclosure relates to a method of manufacturing an optoelectronic component.

BACKGROUND

Optoelectronic components with optoelectronic semiconductor chips embedded in a casting material are known. Optoelectronic components whose casting material has a roughened cast surface are also known.

There is nonetheless a need to provide an improved method of manufacturing an optoelectronic component.

SUMMARY

We provide a method of manufacturing an optoelectronic component including providing a carrier with an upper side; arranging an optoelectronic semiconductor chip above the upper side of the carrier; arranging a casting material over the upper side of the carrier, wherein the optoelectronic semiconductor chip is embedded in the casting material, and the casting material forms a cast surface; and removing a portion of the casting material at the cast surface, wherein a topography is generated at the cast surface, and the removal of a portion of the casting material at the cast surface takes place through laser interference structuring.

LIST OF REFERENCE SIGNS

Figure 1:
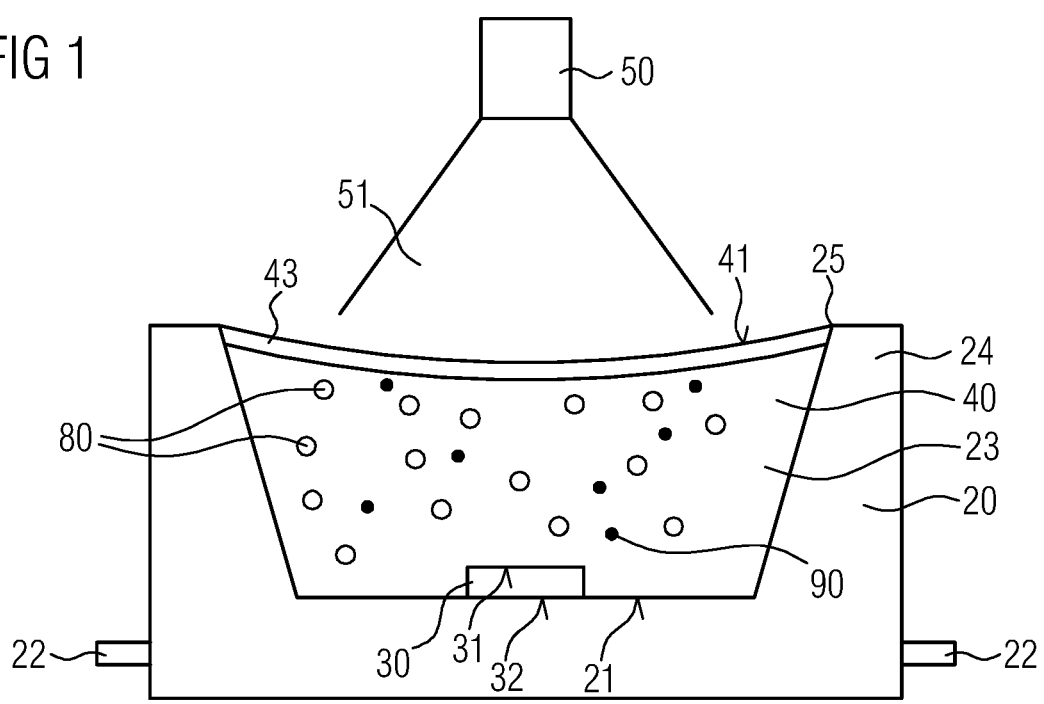
FIG. 1 schematically shows spraying an etching agent onto a cast surface.

10 Optoelectronic component
20 Carrier
21 Upper side of the carrier
22 Electric connection for an optoelectronic semiconductor chip
23 Cavity
24 Wall
25 Upper edge of the wall
30 Optoelectronic semiconductor chip
31 Upper side of the optoelectronic semiconductor chip
32 Lower side of the optoelectronic semiconductor chip
40 Casting material
41 Cast surface
42 Fragments of the casting material
43 Further compound
50 Spray head
51 Etching agent
52 Container for the etching agent
60 Ions
70 First laser
71 Second laser
72 Laser radiation
80 Particles
90 Wavelength-converting fluorescent material
100 Irregularities

DETAILED DESCRIPTION

Our method of manufacturing an optoelectronic component has the following method steps. A carrier with an upper side is prepared. An optoelectronic semiconductor chip is arranged above the upper side of the carrier. A casting material is further arranged over the upper side of the carrier, wherein the optoelectronic semiconductor chip is embedded in the casting material. The casting material forms a cast surface. A portion of the casting material is removed at the cast surface. A topography is thus generated at the cast surface. The topography produced through removal of a portion of the casting material at the cast surface offers the advantage that electromagnetic radiation arriving from outside can be scattered diffusely at the cast surface. A specular reflection of the electromagnetic radiation at the cast surface can thereby be suppressed. It is thus possible to achieve a reduction in or eliminate the gloss of the cast surface. This can, for example, be significant for display screens that can comprise a plurality of optoelectronic components and set up in a bright environment. A suppressed specular reflection at the cast surface can, for example, enable elements in particular whose display is to be dark or black to be displayed without gloss effects. The method of manufacturing the optoelectronic component offers the advantage that such a topography of the cast surface can be created in a simple manner, namely through removal of a portion of the casting material at the cast surface.

The casting material may be hardened before removal of a portion of the casting material at the cast surface. Advantageously, hardening of the casting material makes it possible for a portion of the casting material at the cast surface to be removed, wherein the topography generated at the cast surface is retained.

Removal of a portion of the casting material at the cast surface may take place through wet chemical etching. The wet chemical etching is advantageously very easy to carry out.

An etching agent may be sprayed onto the cast surface. This variant of the method can also advantageously be used to manufacture a plurality of optoelectronic components in that the etching agent is sprayed over a large area.

The cast surface may be immersed in an etching agent. Advantageously, the etching agent is not atomized in this way. This is of particular advantage in etching agents that are harmful to health.

Removal of a portion of the casting material at the cast surface may take place through dry etching. Removal of a portion of the casting material at the cast surface through dry etching advantageously takes place without the use of etching agents that are potentially harmful to health.

Removal of a portion of the casting material at the cast surface may take place through laser interference structuring. Removal of a portion of the casting material at the cast surface through laser interference structuring also advantageously takes place without the use of etching agents that are potentially harmful to health. A further advantage is found in that the topography generated at the cast surface can be monitored since the precise formation of the topography is influenced by an interference pattern.

The casting material may comprise embedded particles. Advantageously, the particles can be provided to scatter the incoming electromagnetic radiation diffusely in the casting material. This can reduce the gloss at other components of the optoelectronic component. The further particles can, for example, be provided to suppress the gloss at a lead frame, wherein the optoelectronic semiconductor chip can be arranged at the lead frame. The particles can furthermore be provided to adjust the thermal expansion coefficient of the casting material. It is, for example, possible that the carrier and casting material have coefficients of thermal expansion that differ such that a thermal stress, for example, during operation of the optoelectronic component would lead to damage to the optoelectronic component. A thermal stress could, for example, have the effect of a delamination of the casting material from the carrier, whereby, for example, moisture could penetrate into the optoelectronic component. The particles can be configured to prevent such effects.

Particles may be exposed by removal of a portion of the casting material at the cast surface. Advantageously, the particles exposed at the cast surface contribute to generation of a diffusely scattering cast surface.

Particles may be released from the casting material when a portion of the casting material at the cast surface is removed. Advantageously, particles released when a portion of the casting material at the cast surface is removed leave irregularities in the cast surface that can also contribute to the fact that incoming electromagnetic radiation can be scattered diffusely at the cast surface.

The casting material may comprise a wavelength-converting fluorescent material. The wavelength-converting fluorescent material is advantageously configured to modify a wavelength of electromagnetic radiation that can be emitted from the optoelectronic semiconductor chip in that the wavelength-converting fluorescent material absorbs the electromagnetic radiation emitted from the optoelectronic semiconductor chip and thereupon emits electromagnetic radiation with a different wavelength. It is, for example, possible that the optoelectronic semiconductor chip is designed to emit blue light, while the wavelength-converting fluorescent material embedded in the casting material is configured to absorb the blue light and, for example, emit yellow light. In this example, the optoelectronic component can radiate in total light giving a white color impression.

The above-described properties, features and advantages and the manner in which they are achieved, are clearer and significantly more comprehensible in connection with the following description of examples, which will be explained in more detail in connection with the drawings.

FIGS. 1 to 4 each show variants of a method of manufacturing an optoelectronic component 10.

A carrier 20 with an upper side 21 is prepared. In the example shown in FIG. 1, the carrier 20 is formed as a housing body. The carrier 20, configured as a housing body, comprises a cavity 23 enclosed laterally by a wall 24. This is not, however, an essential requirement. The carrier 20 can also be a flat substrate so that the cavity 23 and the wall 24 can be omitted. Only that variant of the carrier 20 in which the carrier 20 is formed as a housing body is shown as an example in FIGS. 1 to 5.

If the carrier 20 is formed as a housing body, it can comprise a plastic, for example, a polyphthalamide (PPA). The carrier 20 can, for example, be manufactured using a molding method, for example, an injection molding method. If the carrier 20 is a flat substrate, the carrier 20 can, for example, be a metal substrate, a semiconductor substrate, a semiconductor oxide substrate, a ceramic substrate, a glass substrate or a printed circuit board.

An optoelectronic semiconductor chip 30 is arranged over the upper side 21 of the carrier 20. The optoelectronic semiconductor chip 30 comprises an upper side 31 and a lower side 32 opposite the upper side 31. The optoelectronic semiconductor chip 30 is arranged with its lower side 32 above the upper side 21 of the carrier 20.

The optoelectronic semiconductor chip 30 can, for example, be designed to emit electromagnetic radiation at its upper side 31. The optoelectronic semiconductor chip 30 can, however, also be designed to detect electromagnetic radiation arriving at the upper side 31. The optoelectronic semiconductor chip 30 can thus, for example, be a light-emitting diode chip or a photodiode chip.

To supply the optoelectronic semiconductor chip 30 with electrical energy for operation, the carrier 20 comprises laterally protruding electrical terminals 22. The electrical terminals 22 can, for example, be part of a metal lead frame that can be embedded in the carrier 20 formed as a housing body. A lead frame typically comprises a first and a second lead frame segment, wherein the lead frame segments are exposed at the upper side 21 of the carrier 20 (not illustrated in FIG. 1). The optoelectronic semiconductor chip 30 can be arranged at the first segment of the lead frame, wherein the optoelectronic semiconductor chip 30 can be connected to the second segment of the lead frame by a bond wire. In this example, the optoelectronic semiconductor chip 30 comprises a contact surface at its upper side 31 and a further contact surface at its lower side 32.

An optoelectronic semiconductor chip 30 is arranged above the upper side 21 of the carrier 20 in the illustrations of FIGS. 1 to 5. A plurality of optoelectronic semiconductor chips 30 can, however, also be arranged above the upper side 21 of the carrier 20. Three optoelectronic semiconductor chips 30 can, for example, be arranged above the upper side 21 of the carrier 20. The three optoelectronic semiconductor chips 30 can, for example, be designed to emit electromagnetic radiation of different wavelengths. The three optoelectronic semiconductor chips 30 can, for example, form an RGB pixel. In this example, the optoelectronic semiconductor chips 30 emit red, green and blue light.

A casting material 40 is arranged over the upper side 21 of the carrier 20. In the example of FIG. 1, the casting material 40 is arranged in the cavity 23. Since the carrier 20 does not necessarily have to be formed as a housing body, the casting material 40 also does not necessarily have to be arranged in a cavity 23. If the carrier 20 is formed, for example, as a flat substrate, the casting material 40 can be arranged over the upper side 21 of the carrier 20 such that the casting material 40 forms, for example, a lens. The casting material 40 forms a cast surface 41 in both examples.

The casting material 40 can comprise a plastic, for example, an epoxide or a silicone. The casting material 40 can, for example, be arranged over the upper side 21 of the carrier 20 by a dosing method.

The casting material 40 has been arranged up to an upper edge 25 of the wall 24 in the cavity 23 as shown in FIGS. 1 to 5. This is also not an essential requirement. When the carrier 20 is formed as a housing body, a plurality of casting materials 40 can also be arranged in layers in the cavity 23. This is indicated by way of example in FIG. 1, where a further compound 43 is arranged above the casting material 40. The further compound 43 also comprises a plastic, for example, an epoxide or a silicone. The further compound 43 can also be arranged over the cast surface 41 by a dosing method. The further compound 43 can also however be omitted. The fact that the further compound 43 can be arranged over the cast surface 41 is explained by way of example with reference to FIG. 1. For the sake of simplicity, the further compound 43 is not given further consideration in the following description.

Particles 80 are embedded in the casting material 40. The particles 80 can, for example, comprise silicon dioxide or titanium dioxide. The particles 80 can have a spherical form as shown in FIG. 1. This is not, however, an essential requirement. The particles 80 can also have another form, for example, a floccular form. An average diameter of the particles 80 can, for example, be 1 µm to 30 µm. Deviations from the average diameter are possible.

The particles 80 can, for example, be provided to scatter incoming electromagnetic radiation diffusely in the casting material 40. It is possible in this way to ensure that a gloss at a lead frame is prevented. The particles 80 can furthermore bring about an adjustment of the coefficient of thermal expansion of the casting material 40. The particles 80 can, however, also be omitted.

The optoelectronic component 10 can, furthermore, have a wavelength-converting fluorescent material 90 embedded in the casting material 40. The wavelength-converting fluorescent material 90 is configured to convert a wavelength of electromagnetic radiation emitted from the optoelectronic semiconductor chip 30. The wavelength-converting fluorescent material 90 can, for example, be present in the form of particles. Particles that as a consequence of an absorption of electromagnetic radiation from a first spectral region emit electromagnetic radiation from a different spectral region come into consideration. The wavelength-converting fluorescent material 90 can, for example, comprise a granular fluorescent material doped with rare earths, for example, an yttrium-aluminum granulate doped with cerium ions (Ce:YAG) which is typically configured to generate a larger wavelength through fluorescence. The wavelength-converting fluorescent material 90 can, however, also be omitted.

In all four examples of the method of manufacturing an optoelectronic component 10 illustrated in FIGS. 1 to 4, hardening of the casting material 40 takes place before removal of a portion of the casting material 40 at the cast surface 41.

To generate a topography at the cast surface 41 that is suitable for scattering electromagnetic radiation diffusely, an etching agent 51 is sprayed onto the cast surface 41 according to FIG. 1 by a spray head 50. The etching agent 51 removes a portion of the casting material 40 at the cast surface 41. Grooves and other irregularities 100 that are suitable for scattering electromagnetic radiation diffusely arise in the cast surface 41 as a result.

Figure 2:
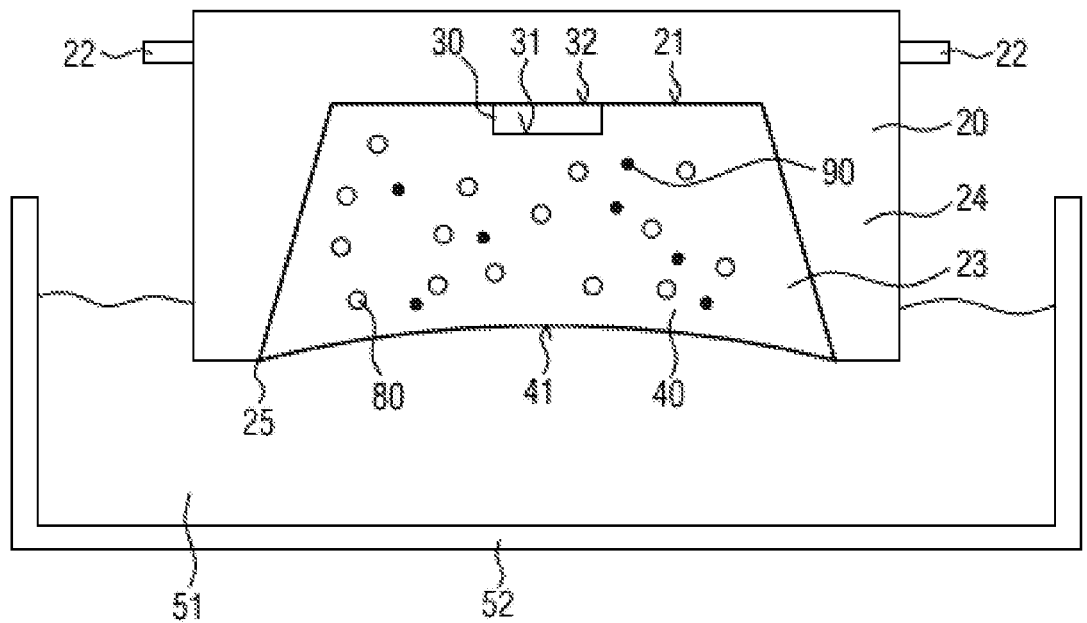
FIG. 2 schematically shows an immersion of a cast surface into an etching agent.

A wet chemical etching, as illustrated in FIG. 1, does not, however, necessarily have to take place by spraying an etching agent 51. FIG. 2 shows an example of the method of manufacturing an optoelectronic component 10, wherein the etching agent 51 is not sprayed onto the cast surface 41. The cast surface 41 is instead immersed in the etching agent 51. The element indicated by reference sign 52 in FIG. 2 represents a container 52 for etching agent 51.

Solvents for the casting material 40 may be considered as etching agent 51. If the casting material 40 comprises, for example, ester groups, for example, consisting of anhydride-hardened epoxide, then an aqueous or alcoholic solution of potassium hydroxide (potash lye) or an organic base in a suitable solvent can, for example, be used as the etching agent 51.

It is possible that the etching agent 51 comes into contact both with the cast surface 41 as well as with the plastic that forms the housing body. In this example, a surface of the housing body can also be subjected to an etching process, whereby the housing body can also diffusely scatter incoming electromagnetic radiation. A masking is furthermore possible, which allows either the casting material 40 at the cast surface 41 or the surface of the housing body to be etched selectively.

In one example of the method of manufacturing an optoelectronic component 10, a portion of the casting material 40 at the cast surface 41 is removed by dry etching, whereby the cast surface 41 is roughened. This can take place chemically, physically, or through a combination of both methods.

Chemically active ions, excited species or reactive molecules (e.g., ozone) can react with the casting material 40 at the cast surface 41 so that gaseous reaction products arise. In this example, the cast surface 41 is etched chemically. Generation of chemically reactive particles can, for example, take place through a plasma of suitable gases (preferably oxygen, hydrogen, $NF_3$ or other gases containing fluorine, or gas mixtures that contain one or more of these gases). Chemically reactive particles can, however, also be generated without the use of a plasma, for example, by an ozone generator.

Figure 3:
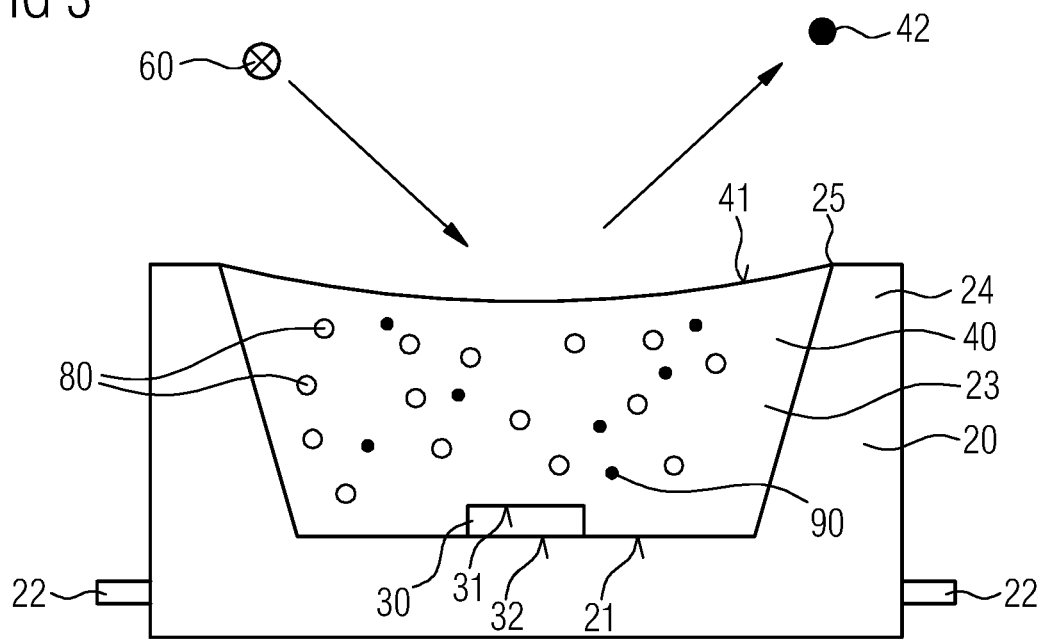
FIG. 3 schematically shows dry etching of a cast surface.

Physical removal of a portion of the casting material 40 at the cast surface 41 can take place through ions 60 accelerated at the cast surface 41 that is to be eroded. FIG. 3 shows this example of the method of manufacturing an optoelectronic component 10. The accelerated ions 60 can release or atomize fragments 42 of the casting material 40 at the cast surface 41 through the transfer of an impulse (sputtering). A topography is generated at the cast surface 41 as a result, which allows electromagnetic radiation that meets the cast surface 41 to be scattered diffusely. The ions 60 can be generated by a plasma of suitable gases (for example, argon, neon, krypton or other noble gases, or oxygen, or gas mixtures containing these gases).

The ions 60 are accelerated by electric and/or magnetic fields. A cathode can, for example, be arranged underneath the carrier 20 to accelerate the ions 60 in the direction of the cast surface 41. The acceleration voltage then lies between the cathode and an ion source, wherein the carrier 20 is arranged between the ion source and the cathode.

Chemical and physical removal of a portion of the casting material 40 at the cast surface 41 can also be combined with one another, for example, through addition of reactive gas to a plasma sputtering process.

Roughening of the cast surface 41 through removal of a portion of the casting material 40 at the cast surface 41 can be adapted to the casting material 40 to be eroded and the desired roughness through the skillful selection of the process parameters.

Figure 4:
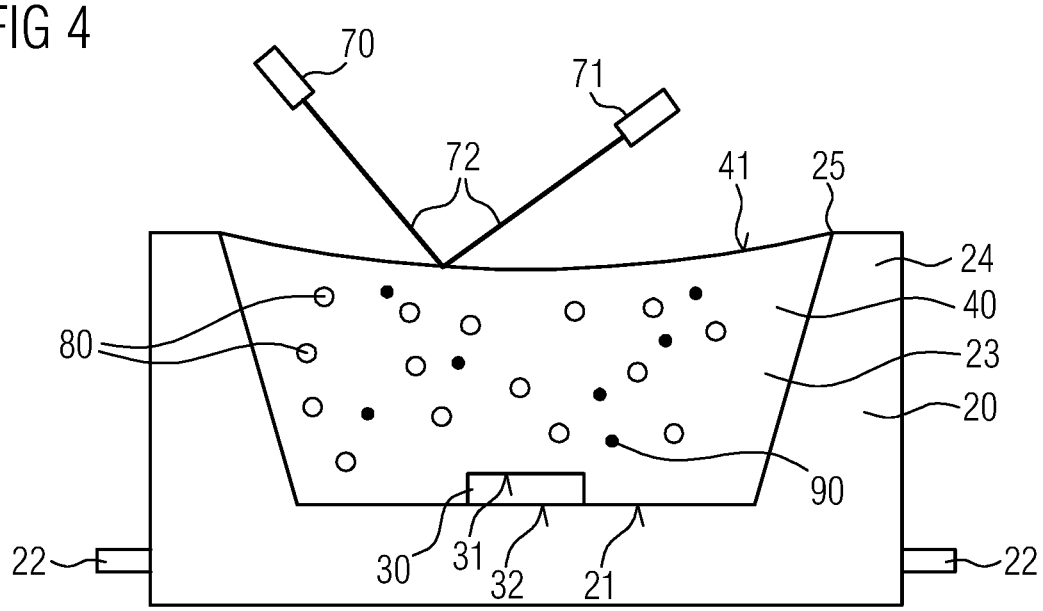
FIG. 4 schematically shows removal of the casting material at the cast surface through laser interference structuring.

FIG. 4 shows a further example of the method of manufacturing an optoelectronic component 10. In this example, removal of a portion of the casting material 40 at the cast surface 41 takes place through laser interference structuring. At least two lasers 70, 71 that emit coherent laser radiation 72 are aimed at the cast surface 41. An interference pattern is generated at the cast surface 41 through an interference between the laser radiation 72 of the first laser 70 and of the second laser 71. A topography is created at the cast surface 41 corresponding to the interference pattern at the cast surface 41. Irradiation of the cast surface 41 with the laser radiation 72 takes place with the most highly energetic pulses possible so that the interference pattern can be transferred to the cast surface 41. UV lasers can, for example, be employed as the first laser 70 and as the second laser 71.

The cast surface 41 becomes heated during irradiation of the cast surface 41 with the laser radiation 72. The cast surface 41 is heated locally. The interference pattern determines the local heating of the casting material 40. Wherever interference maxima are present, a local ablation process occurs at the cast surface 41, meaning that the casting material 40 heats up such that a sudden evaporation process occurs. The casting material 40 can thereby be eroded locally, meaning that a portion of the casting material 40 at the cast surface 41 is removed. It is thus possible to create periodic structures at the cast surface 41 which exhibit a periodicity corresponding to the interference pattern of the laser radiation 72. These periodic structures form a topography of the cast surface 41 which is suitable for diffusely scattering incoming electromagnetic radiation. A specular reflection of the electromagnetic radiation at the cast surface 41 is thereby suppressed.

Alternatively, removal of a portion of the casting material 40 at the cast surface 41 takes place by blasting with compressed air or water in combination with a solid abrasive. This method can also be referred to as blasting or wet blasting. The solid abrasive can, for example, be sand. In compressed air or water blasting, the abrasive is accelerated by a nozzle and aimed at the cast surface 41. The abrasive removes a portion of the casting material 40 at the cast surface, whereby irregularities 100 remain at the cast surface 41. These irregularities 100 form a topography of the cast surface 41 which is suitable for diffusely scattering incoming electromagnetic radiation. A specular reflection of the electromagnetic radiation at the cast surface 41 can thereby be suppressed. A rougher cast surface 41 can be created by the compressed air or water blasting compared to the methods illustrated in FIGS. 1 to 4.

In addition to irregularities 100 that can be produced by removal of a portion of the casting material 40 at the cast surface 41 by one of the methods shown in FIGS. 1 to 4 or through the compressed air or water blasting in combination with the solid abrasive, particles 80 can also be exposed when a portion of the casting material 40 is removed at the cast surface 41. This can also lead to creation of irregularities 100 at the cast surface 41. In addition, particles 80 can be released from the casting material 40 when a portion of the casting material 40 is removed at the cast surface 41. This leaves further depressions and irregularities 100 in the cast surface 41 which are configured to scatter incoming electromagnetic radiation diffusely so that a specular reflection of incoming electromagnetic radiation is suppressed at the cast surface 41.

Figure 5:
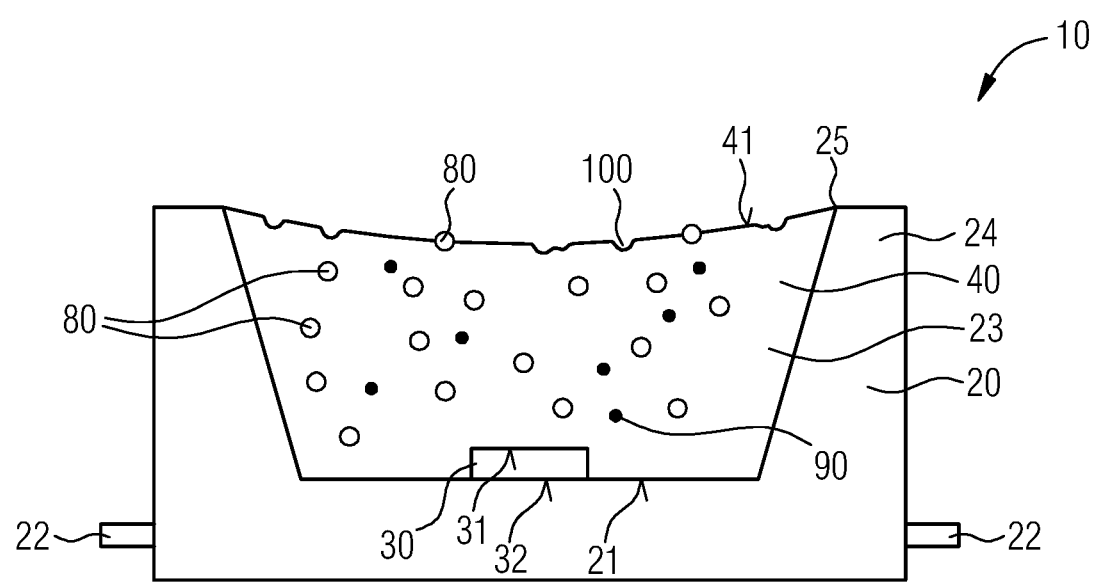
FIG. 5 schematically shows a side view of an optoelectronic component that has been manufactured according to one of the methods shown in FIGS. 1 to 4.

FIG. 5 shows a schematic side view of the optoelectronic component 10 that has been manufactured according to one of the methods shown in FIGS. 1 to 4. It has irregularities 100 that have been created through removal of a portion of the casting material 40 at the cast surface 41. Particles 80 that have been exposed or released at the cast surface 41 can also additionally create irregularities 100.

The optoelectronic component 10 illustrated in FIG. 5 is designed to scatter incoming electromagnetic radiation at the cast surface 41 diffusely. As a result, a specular reflection of electromagnetic radiation arriving at the cast surface 41 is suppressed.

Aside from the fact that removal of a portion of the casting material 40 at the cast surface 41 creates a topography at the cast surface 41 that is configured to scatter diffusely electromagnetic radiation arriving from outside, the topography created at the cast surface 41 can also increase the extraction efficiency of the optoelectronic component 10. The irregularities 100 created at the cast surface 41 can namely suppress a total internal reflection of the electromagnetic radiation emitted by the optoelectronic semiconductor chip 30 at an inner side of the cast surface 41. A greater proportion of the electromagnetic radiation emitted by the optoelectronic semiconductor chip 30 can thereby emerge from the optoelectronic component 10 at the cast surface 41. This is achieved if the irregularities 100 are formed as microstructures with structure sizes in a range, for example, of greater than 1 µm. The irregularities 100 can also be formed to increase the extraction efficiency of the optoelectronic component 10 in that Fresnel reflections at the cast surface 41 are avoided. "Fresnel reflections" refers to reflections of electromagnetic radiation at a boundary surface that accord with Fresnel's formula. Avoidance of Fresnel reflections can be achieved in that the irregularities 100 are formed as sub-micrometer structures or as nanostructures, with structure sizes smaller, for example, than 1 µm, in particular with structure sizes of 100 nm to 400 nm. It is also possible that the cast surface 41 comprises both irregularities 100 to suppress total internal reflections as well as irregularities 100 to suppress Fresnel reflections. This can, for example, be achieved in that two interference patterns with different periodicities are generated in a two-stage process when structuring the cast surface 41 through laser interference. A microstructure can be applied to the cast surface 41 by a first interference pattern. A sub-microstructure or a nanostructure that is overlaid on the microstructure can be applied to the cast surface 41 by a second interference pattern.

To improve the outward coupling of the light, microstructures with a periodicity of 1 µm to 100 µm are generated, and an aspect ratio between height and width of 0.5 to 1.5 is generated. The microstructures should here have the widest possible range of gradient distribution. The microstructures should thus be curved, for example, being formed in the shape of hemispherical microlenses. The microstructures can also be overlaid with a further structure having a further periodicity. The microstructures can, for example, have a sinusoidal modulation. To maintain the lowest possible proportion of planar surface regions at the cast surface 41, the microstructures can, for example, be arranged hexagonally. Alternatively the microstructures can, for example, be formed as a cruciform structure or randomly distributed with a certain overlap.

In addition to the laser interference structuring, which allows microstructures with lateral structure sizes less than about 15 µm to be generated, a direct writing laser method (DLW, direct laser writing) can in particular be employed as a method. This allows microstructures with lateral structure sizes of up to 100 µm to be generated.

The method of manufacturing an optoelectronic component 10 is not restricted to the individual optoelectronic components 10. A two-dimensional composite of a plurality of optoelectronic components 10, for example, an LED array with irregularities 100 simultaneously generated on a plurality of cast surfaces 41 can also, for example, be provided. Individual optoelectronic components 10 can also be manufactured by dicing the composite. As a result, the irregularities 100 do not have to be generated on each individual optoelectronic component 10.

Our methods and components have been illustrated and described in more detail with reference to preferred examples. However, this disclosure is not limited to the examples. Rather, different variations can be derived by those skilled in the art without departing the scope of protection of the appended claims.

This application claims priority of DE 10 2017 117 438.9, the subject matter of which is incorporated herein by reference.

The invention claimed is:

1. A method of manufacturing an optoelectronic component comprising:
    providing a carrier with an upper side;
    arranging an optoelectronic semiconductor chip above the upper side of the carrier;
    arranging a casting material over the upper side of the carrier, wherein the optoelectronic semiconductor chip is embedded in the casting material, and the casting material forms a cast surface; and
    removing a portion of the casting material at the cast surface, wherein a topography is generated at the cast surface, and the removal of a portion of the casting material at the cast surface takes place through laser interference structuring.

2. The method as claimed in claim 1, wherein before removal of a portion of the casting material at the cast surface the casting material is hardened.

3. The method as claimed in claim 1, wherein the casting material comprises embedded particles.

4. The method as claimed in claim 3, wherein particles are exposed by removal of a portion of the casting material at the cast surface.

5. The method as claimed in claim 3, wherein particles are released from the casting material when a portion of the casting material at the cast surface is removed.

6. The method as claimed in claim 1, wherein the casting material comprises a wavelength-converting fluorescent material.

* * * * *